(12) United States Patent
Su et al.

(10) Patent No.: US 11,239,264 B2
(45) Date of Patent: Feb. 1, 2022

(54) THIN FILM TRANSISTOR, DISPLAY SUBSTRATE, METHOD FOR PREPARING THE SAME, AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Tongshang Su, Beijing (CN); Dongfang Wang, Beijing (CN); Qinghe Wang, Beijing (CN); Liangchen Yan, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/652,219

(22) PCT Filed: Oct. 18, 2019

(86) PCT No.: PCT/CN2019/111844
§ 371 (c)(1),
(2) Date: Mar. 30, 2020

(87) PCT Pub. No.: WO2020/114101
PCT Pub. Date: Jun. 11, 2020

(65) Prior Publication Data
US 2021/0134852 A1   May 6, 2021

(30) Foreign Application Priority Data
Dec. 6, 2018 (CN) .......... 201811486004.X

(51) Int. Cl.
*H01L 21/00* (2006.01)
*H01L 27/12* (2006.01)

(52) U.S. Cl.
CPC ...... *H01L 27/1262* (2013.01); *H01L 27/1237* (2013.01); *H01L 27/1244* (2013.01)

(58) Field of Classification Search
CPC ............ H01L 27/1262; H01L 27/1237; H01L 27/1244
See application file for complete search history.

(56) References Cited

U.S. PATENT DOCUMENTS 9,240,353 B2 * 1/2016 Yang ............... H01L 21/823871
2003/0183339 A1 10/2003 Sasaoka et al.
(Continued)

FOREIGN PATENT DOCUMENTS

| CN | 1449234 A | 10/2003 |
|---|---|---|
| CN | 1945841 A | 4/2007 |

(Continued)

OTHER PUBLICATIONS

Machine translation of CN 1945841 (Year: 2021).*
(Continued)

*Primary Examiner* — Richard A Booth
(74) *Attorney, Agent, or Firm* — Muncy, Geissler, Olds & Lowe, P.C.

(57) ABSTRACT

The present disclosure provides a thin film transistor, a display substrate, a method for preparing the same, and a display device including the display substrate. The method for preparing the thin film transistor includes: forming an inorganic insulating film layer in contact with an electrode of the thin film transistor by a plasma enhanced chemical vapor deposition process at power of 9 kW to 25 kW, at a temperature of 190° C. to 380° C. and by using a mixture of gases $N_2$, $NH_3$ and $SiH_4$ in a volume ratio of $N_2:NH_3:SiH_4=$
(Continued)

treating the substrate to be deposited with the inorganic insulating layer for 30 to 40 seconds by a plasma having power of 6 kW to 12 kW and a gas volume ratio of $N_2:NH_3= 1 \sim 5$ depositing the silicon nitride inorganic insulating layer at power of 9 kW to 25 kW, at a temperature of 190 °C to 380 °C and by using a mixture of gases $N_2$, $NH_3$ and $SiH_4$ in a volume ratio of $N_2:NH_3:SiH_4=(10 \sim 20):(5\sim10):(1\sim2)$ (10~20):(5~10):(1~2), such that a stress value of the inorganic insulating film layer is reduced to be less than or equal to a threshold, and the inorganic insulating layer comprises silicon nitride.

8 Claims, 1 Drawing Sheet

(56) References Cited

U.S. PATENT DOCUMENTS

| | | |
|---|---|---|
| 2009/0185126 A1 | 7/2009 | Kim et al. |
| 2014/0113439 A1 | 4/2014 | Patel et al. |
| 2015/0144951 A1* | 5/2015 | Kim .................. H01L 29/4908 257/72 |
| 2016/0293636 A1 | 10/2016 | Zou et al. |
| 2020/0152663 A1* | 5/2020 | Li ...................... H01L 27/1251 |

FOREIGN PATENT DOCUMENTS

| | | |
|---|---|---|
| CN | 101127357 A | 2/2008 |
| CN | 102629555 A | 8/2012 |
| CN | 103345008 A | 10/2013 |
| CN | 103938179 A | 7/2014 |
| CN | 104494277 A | 4/2015 |
| CN | 104716201 A | 6/2015 |
| CN | 108831627 A | 11/2018 |
| CN | 109616418 A | 4/2019 |

OTHER PUBLICATIONS

Office Action of CN Application No. 201811486004X and English translation, dated Dec. 30, 2019, 14 pages.
Office Action of CN Application No. 201811486004 X and English translation, dated Jul. 8, 2020, 12 pages.
International Search Report of PCT/CN2019/111844 and English translation, dated Jan. 16, 2020, 16 pages.

* cited by examiner treating the substrate to be deposited with the
inorganic insulating layer for 30 to 40 seconds
by a plasma having power of 6 kW to 12 kW
and a gas volume ratio of $N_2:NH_3= 1 \sim 5$ depositing the silicon nitride inorganic insulating layer at
power of 9 kW to 25 kW, at a temperature of 190 °C to
380 °C and by using a mixture of gases $N_2$, $NH_3$ and $SiH_4$
in a volume ratio of $N_2:NH_3:SiH_4=(10 \sim 20):(5\sim10):(1\sim2)$

THIN FILM TRANSISTOR, DISPLAY SUBSTRATE, METHOD FOR PREPARING THE SAME, AND DISPLAY DEVICE

CROSS-REFERENCE TO RELATED APPLICATIONS

This application is the U.S. national phase of PCT Application No. PCT/CN2019/111844 filed on Oct. 18, 2019, which claims a priority to Chinese Patent Application No. 201811486004 filed on Dec. 6, 2018, the disclosures of which are incorporated in their entirety by reference herein.

TECHNICAL FIELD

The present disclosure relates to the field of display technology, in particular, to a thin film transistor, a display substrate, a method for preparing the same, and a display device including the display substrate.

BACKGROUND

As the size of thin film transistor displays becomes increasingly larger, the problem of RC delay becomes more and more serious. Copper wires have the characteristics of low resistivity and high electrical mobility. Thus copper wires can significantly reduce the delay effect of resistance and capacitance, improve the operating speed of thin film transistors, and meet the requirements of high-end display devices. Therefore, the technology using copper wires has become a development trend of thin film transistors.

However, many problems will occur during the preparation process of thin film transistors using copper wires. For example, in an oxide thin film transistor, an inorganic insulating film layer, such as silicon nitride, silicon oxynitride, and silicon oxide film layer, needs to be deposited on a copper wire. Due to the mismatch of stress between the copper wire and the inorganic insulating film, there will be a stress gap between the copper wire and the inorganic insulating film layer. The stress gap will cause a high incidence of bulging of the inorganic insulating film layer, and then cause a series of failures, such as DGS (short circuit between the source/drain metal layer pattern and the gate metal layer pattern). These will eventually seriously reduce the yield of the display product.

SUMMARY

In one aspect, the present disclosure provides a method for preparing a thin film transistor, including: forming an inorganic insulating layer in contact with an electrode of the thin film transistor by a plasma vapor deposition process at power of greater than 9 kW, such that a stress value of the inorganic insulating film layer is reduced to be less than or equal to a threshold.

Optionally, the threshold is 80 MPa or less.

Optionally, the method for preparing the thin film transistor further includes: performing plasma treatment on a surface of the substrate to be deposited with the inorganic insulating layer before depositing the inorganic insulating layer.

Optionally, the inorganic insulating layer includes silicon nitride, and the step of depositing the inorganic insulating layer includes: depositing the silicon nitride inorganic insulating layer at power of 9 kW to 25 kW, at a temperature of 190° C. to 380° C. and by using a mixture of gases $N_2$, $NH_3$ and $SiH_4$ in a volume ratio of $N_2:NH_3:SiH_4=10\ 20:5\sim10:1\sim2$.

Optionally, the step of performing the plasma treatment on the surface of the substrate to be deposited with the inorganic insulating layer includes: treating the substrate to be deposited with the inorganic insulating layer for 30 to 40 seconds by a plasma having power of 6 kW to 12 kW and a gas volume ratio of $N_2:NH_3=1\sim5$.

Optionally, the inorganic insulating layer is a gate insulating layer, and an electrode of the thin film transistor is a metal Cu electrode.

In another aspect, the present disclosure also provides a thin film transistor which is prepared by the method for preparing the thin film transistor as described above.

Optionally, the thin film transistor includes a Cu gate electrode and a silicon nitride inorganic insulating layer in contact with the Cu gate electrode, and a stress value of the silicon nitride inorganic insulating layer is 80 MPa or less.

In yet another aspect, the present disclosure also provides a method for preparing a display substrate, including: forming an inorganic insulating layer in contact with a conductive pattern of the display substrate by a plasma enhanced chemical vapor deposition process at power of greater than 9 kW, such that a stress value of the inorganic insulating layer is reduced to be less than or equal to a threshold.

Optionally, the threshold is 80 MPa or less.

Optionally, the method further includes: performing plasma treatment on a surface of the substrate to be deposited with the inorganic insulating layer before depositing the inorganic insulating layer.

Optionally, the inorganic insulating layer includes silicon nitride, and the step of depositing the inorganic insulating layer includes: depositing the silicon nitride inorganic insulating layer at power of 9 kW to 25 kW, at a temperature of 190° C. to 380° C. and by using a mixture of gases $N_2$, $NH_3$ and $SiH_4$ in a volume ratio of $N_2:NH_3:SiH_4=10\sim20:5\sim10:1\sim2$.

Optionally, the step of performing the plasma treatment on the surface of the substrate to be deposited with the inorganic insulating layer includes: treating the substrate to be deposited with the inorganic insulating layer for 30 to 40 seconds by a plasma having power of 6 kW to 12 kW and a gas volume ratio of $N_2:NH_3=1\sim5$.

Optionally, the inorganic insulating layer is a gate insulating film, and the conductive pattern is a metal Cu conductive pattern.

In yet another aspect, the present disclosure also provides a display substrate prepared by the method described above.

Optionally, the display substrate includes a thin film transistor including a Cu gate electrode and a silicon nitride inorganic insulating layer in contact with the Cu gate electrode, a stress value of the silicon nitride inorganic insulating layer is 80 MPa or less.

In yet another aspect, the present disclosure also provides a display device including the display substrate as described above.

Optionally, the thin film transistor in the display device includes a Cu gate electrode and a silicon nitride inorganic insulating layer in contact with the Cu gate electrode, and a stress value of the silicon nitride inorganic insulating layer is 80 MPa or less.

DETAILED DESCRIPTION

Figure 1:
FIG. 1 is a schematic view showing a method of preparing a thin film transistor according to an embodiment of the present disclosure.
Figure 2:
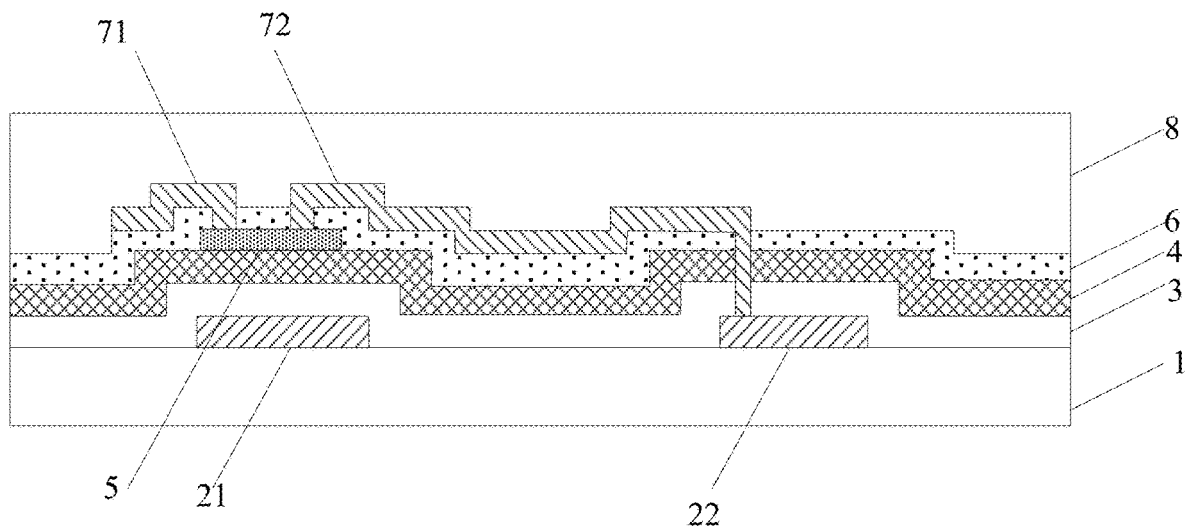
FIG. 2 is a schematic view showing a cross section of an oxide thin film transistor prepared by the method according to an embodiment of the present disclosure.

In order to make the technical problems to be solved, the technical solutions, and the advantages of the examples of the present disclosure, the present disclosure will be described hereinafter in conjunction with the drawings and specific examples.

The technical problem to be solved by the present disclosure is to provide a thin film transistor, a display substrate and a method for preparing the same, and a display device including the display substrate, which can solve the problem of stress mismatch between the conductive pattern and the inorganic insulating film layer, and improve the yield of display products.

In the related technology, due to the mismatch of stress between the copper wire and the inorganic insulating film, it will cause a high incidence of bulging of the inorganic insulating film layer, and then cause a series of failures, such as DGS, and will eventually seriously reduce the yield of the display product. In view of the above problems in the related art, the present disclosure provides a thin film transistor, a display substrate and a method for preparing the same, and a display device including the display substrate, which can solve the problem of stress mismatch between the conductive pattern and the inorganic insulating film layer, and improve the yield of display products.

In one aspect, the present disclosure provides a method of preparing a thin film transistor, the method including: forming an inorganic insulating layer in contact with an electrode of the thin film transistor by a plasma enhanced chemical vapor deposition (PECVD) process at power of greater than 9 kW, such that a stress value of the inorganic insulating layer is reduced to be less than or equal to a threshold. Optionally, the threshold is 80 MPa or less. Optionally, the threshold is 60 MPa or less, 40 MPa or less, or 20 MPa or less.

The method of the above embodiments according to the present disclosure can produce the following advantageous technical effects:

a. In the disclosed embodiment, when the inorganic insulating layer in contact with the electrode of the thin film transistor is formed by a plasma enhanced chemical vapor deposition process, the inorganic insulating layer is deposited at power of greater than 9 kW, such that the stress value of the inorganic insulating layer is reduced to a threshold of 80 MPa or less. Thus the stress gap between the inorganic insulating layer and the electrode of the thin film transistor is reduced, and thereby the problem of the stress mismatch between the thin film transistor electrode and the inorganic insulating layer is solved. Therefore, this method according to the present disclosure can reduce the occurrence probability of bulging of the inorganic insulating layer, and improve the yield of the thin film transistor.

Optionally, before depositing the inorganic insulating layer, the method of the embodiment of the present disclosure further includes: performing plasma treatment on a surface of the substrate to be deposited with the inorganic insulating layer.

The embodiments of the present disclosure are directed to the aforementioned technical problems in the related art, and provide a thin film transistor, a display substrate, a method for preparing the same, and a display device, which can solve the problem of stress mismatch between the conductive pattern and the inorganic insulating layer, and improve the yield of display products.

Stress is a product of strain and elastic modulus in $N/mm^2$. The stress value is that when an object is deformed due to external factors (force, humidity, temperature field changes, etc.), the internal force that interacts with each other is formed between various parts of the object, to resist the effect of this external factors, and to attempt to return the object from the position after the deformation to the position before the deformation. The internal force per unit area of the section under investigation is called stress, that perpendicular to the section is called positive stress or normal stress, and that tangent to the section are called shear stress or shearing stress.

In the embodiment of present disclosure, when the inorganic insulating layer in contact with the electrode of the thin film transistor is formed by a plasma enhanced chemical vapor deposition process, the inorganic insulating layer is deposited at power of greater than 9 kW, such that the stress value of the inorganic insulating layer is reduced to be less than or equal to a threshold of 80 MPa. Therefore, this method can reduce the stress gap between the inorganic insulating layer and the electrode of the thin film transistor, solve the problem of the stress mismatch between the electrode of the thin film transistor and the inorganic insulating film layer. Further the occurrence probability of bulging of the inorganic insulating layer is reduced, and the yield of thin film transistors is improved.

Optionally, the thin film transistor is formed on a substrate. Optionally, the method further includes: performing plasma treatment on a surface of the substrate to be deposited with the inorganic insulating layer before depositing the inorganic insulating layer. The plasma treatment on the surface of the substrate to be deposited with the inorganic insulating layer can improve the adhesion of the surface of the substrate to be deposited with the inorganic insulating layer on one hand, and may further reduce the stress value of the inorganic insulating layer on the other hand.

Optionally, the inorganic insulating layer includes silicon nitride, and the step of depositing the inorganic insulating layer includes: depositing the silicon nitride inorganic insulating layer at power of 9 kW to 25 kW, at a temperature of 190° C. to 380° C. and by using a mixture of gases $N_2$, $NH_3$ and $SiH_4$ at a volume ratio of $N_2:NH_3:SiH_4$=10~20:5~10:1~2. Optionally, the temperature is 200° C. to 360° C. Even optionally, the temperature is 340° C. to 360° C. Optionally, the power may be 10 kW to 20 kW, and further may be 14 kW to 19 kW. Optionally, the volume ratio of $N_2:NH_3:SiH_4$ is 12~18:6~8:1~1.5, and further optionally the volume ratio of $N_2:NH_3:SiH_4$ is 14:5:1.

Optionally, the step of performing the plasma treatment on the surface of the substrate to be deposited with the inorganic insulating layer includes: treating the substrate to be deposited with the inorganic insulating layer for 30 to 40 seconds by a plasma having power of 6 kW to 12 kW and a gas volume ratio of $N_2:NH_3$=1~5. Optionally, the power is 8 kW~10 kW. Optionally, the gas volume ratio is $N_2:NH_3$=2~4. Optionally, the gas volume ratio is $N_2:NH_3$=3. The disclosed method of this embodiment is shown in FIG. 1.

Optionally, the PECVD process parameters of the deposited inorganic insulating layer are as follows: a pressure of 500 mT to 2000 mT; and a separation distance (from the diffuser to the substrate) of 400 mil to 1500 mil.

Since copper have the characteristics of low resistivity and high electrical mobility, it can significantly reduce the delay effect of resistance and capacitance, improve the operating speed of thin film transistors, and meet the requirements of high-end display devices. Therefore, the electrode of the thin film transistor is usually a metal Cu electrode. Of course, the electrode of the thin film transistor is not limited to the metal Cu electrode, and other metals such as Ag and Al may also be used.

The stress value of metal Cu is usually up to 300 MPa, and the stress value of inorganic insulating layers prepared by the prior process is usually up to 400 MPa. When the electrode of the thin film transistor uses metal Cu and the inorganic insulating layer uses silicon nitride ($SiN_x$), the stress direction of the electrode is opposite to the stress direction of the inorganic insulating layer, so that the stress gap therebetween is equal to the sum of the stress value thereof. That is, the stress gap is about 700 MPa. After the technical solution of the embodiment of the present disclosure is adopted, the stress value of the inorganic insulating layer can be reduced to 80 MPa or less, so that the stress gap between the inorganic insulating layer and the electrode can be reduced to 380 MPa or less. Therefore, this method according to the present disclosure can improve the problem of stress mismatch between the electrodes of the thin film transistor and the inorganic insulating layer, reduce the occurrence probability of bulging of the inorganic insulating layer, and improve the yield of the thin film transistor. Generally, after the method according to this embodiment is adopted, the stress gap between the inorganic insulating layer and the electrode can be controlled between 350 MPa and 450 MPa. Optionally, the stress gap can be controlled between 350 MPa and 420 MPa; even optionally 360 MPa and 400 MPa; and even optionally 370 MPa and 390 MPa.

The embodiment of the present disclosure further provides a thin film transistor prepared by the method as described above.

Optionally, in the thin film transistor prepared according to the above method, the thin film transistor includes a Cu gate electrode and a silicon nitride inorganic insulating layer in contact with the Cu gate electrode, and a stress value of the silicon nitride inorganic insulating layer is 80 MPa or less. Optionally, the stress gap between the Cu gate electrode and the silicon nitride inorganic insulating layer in contact with the Cu gate electrode is 350 MPa to 450 MPa.

In the thin film transistor of the embodiment of the present disclosure, since the stress value of the inorganic insulating layer is low, the stress gap between the inorganic insulating layer and the electrode of the thin film transistor is reduced, thereby solving the problem of the stress mismatch between the electrode of the thin film transistor and the inorganic insulating layer, reducing the occurrence probability of bulging of the inorganic insulating layer, and improving the yield of thin film transistors.

In the following, the method for preparing the thin film transistor of the present disclosure will be described in detail by taking an oxide thin film transistor as an example, and the method for preparing the thin film transistor of the embodiment of the present disclosure includes the following steps.

Step 1: providing a base substrate 1, and forming patterns of a gate electrode 21 and a gate electrode 22 on the base substrate 1, in which the base substrate may be a glass substrate or a quartz substrate.

Specifically, a gate metal layer having a thickness of about 500 to 4000 Å may be deposited on the base substrate by a sputtering or thermal evaporation process. The gate metal layer may be metals such as Cu, Al, Ag, Mo, Cr, Nd, Ni, Mn, Ti, Ta, W, and alloys of these metals. Optionally, the gate metal layer can use Cu. The gate metal layer may be a single layer structure or a multilayer structure. One layer of photoresist is coated on the gate metal layer, and the photoresist is exposed by using a mask, so that the photoresist forms a photoresist unreserved region and a photoresist reserved region. The photoresist reserved region corresponds to a region in which the patterns of the gate 21 and the gate 22 are located, and the photoresist unreserved region corresponds to a region outside of the above pattern. Then, development processing is performed, so that the photoresist in the photoresist unreserved region is completely removed, and the thickness of the photoresist in the photoresist reserved region remains unchanged. The gate metal film of the photoresist unreserved region is completely etched away by an etching process, and the remaining photoresist is stripped to form patterns of the gate 21 and the gate 22.

Step 2: treating the base substrate 1 after step 1 for 30 to 40 seconds by a plasma having power of 6 kW to 12 kW and a gas volume ratio of $N_2:NH_3=2\sim4$.

Step 3: depositing $SiN_x$ to form the first gate insulating layer 3 at power of 14 kW to 19 kW, at a temperature of 340° C. to 360° C. and by using a mixture of gases $N_2$, $NH_3$ and $SiH_4$ at a volume ratio of $N_2:NH_3:SiH_4=14:5:1$.

Step 4: forming a second gate insulating layer 4.

Specifically, a second gate insulating layer 4 having a thickness of 500 to 5,000 Å may be deposited on base substrate 1 after the step 3 by plasma enhanced chemical vapor deposition (PECVD) process. The second gate insulating layer 4 can be made of an oxide, a nitride, or an oxynitride compound. The corresponding reaction gases are $SiH_4$, $NH_3$, and $N_2$, or the corresponding reaction gases are $SiH_4$, $NH_3$, $N_2$, and $N_2O$.

Step 5: forming an active layer 5.

Specifically, one layer of oxide semiconductor material is deposited on the substrate, one layer of photoresist is coated on the oxide semiconductor material, and the photoresist is exposed by using a mask, so that the photoresist forms a photoresist unreserved region and a photoresist fully reserved region. The photoresist fully reserved region corresponds to a region in which the pattern of the active layer is located, and the photoresist unreserved region corresponds to a region outside the pattern of the active layer. Then, development processing is performed, so that the photoresist in the photoresist unreserved region is completely removed, and the thickness of the photoresist in the photoresist fully reserved region remains unchanged. The semiconductor oxide material of the photoresist unreserved region is completely etched by an etching process to form a pattern of the active layer 5, and the remaining photoresist is stripped.

Step 6: forming an interlayer insulating layer 6.

Specifically, an interlayer insulating layer 6 having a thickness of 500 to 5,000 Å may be deposited on base substrate 1 after the step 5 by plasma enhanced chemical vapor deposition (PECVD) process. The interlayer insulating layer 6 can be made of an oxide, a nitride, or an oxynitride compound. The corresponding reaction gases are $SiH_4$, $NH_3$, and $N_2$, or the corresponding reaction gases are $SiH_4$, $NH_3$, $N_2$, and $N_2O$.

Step 7: forming a source 71 and a drain 72.

Specifically, one layer of source/drain metal having a thickness of about 2000 to 4000 Å may be deposited on the base substrate after step 6 by magnetron sputtering, thermal evaporation or other film formation processes. The source/drain metal layer may be metals such as Cu, Al, Ag, Mo, Cr, Nd, Ni, Mn, Ti, Ta, W, and alloys of these metals. The source/drain metal layer may be a single layer structure or a multilayer structure. Optionally, the multilayer structure is, for example, Cu\Mo, Ti\Cu\Ti, Mo\Al\Mo, and the like. One layer of photoresist is coated on the source/drain metal layer, and the photoresist is exposed by using a mask, so that the photoresist forms a photoresist unreserved region and a photoresist reserved region. The photoresist reserved region corresponds to a region in which the patterns of the source 71 and the drain 72 are located, and the photoresist unreserved region corresponds to a region outside of the above pattern. Then, development processing is performed, so that the photoresist in the photoresist unreserved region is completely removed, and the thickness of the photoresist in the photoresist reserved region remains unchanged. The source/drain metal layer of the photoresist unreserved region is completely etched away by an etching process, and the remaining photoresist is stripped to form the source 71 and the drain 72.

Step 8: forming a passivation layer 8.

Specifically, a passivation layer 8 having a thickness of 500 to 5,000 Å may be deposited on base substrate 1 after the step 7 by plasma enhanced chemical vapor deposition (PECVD) process. The passivation layer 8 can be made of an oxide, a nitride, or an oxynitride compound. The corresponding reaction gases are $SiH_4$, $NH_3$, and $N_2$, or the corresponding reaction gases are $SiH_4$, $NH_3$, $N_2$, and $N_2O$.

In the embodiment of the present disclosure, when the first gate insulating layer in contact with the gate of the thin film transistor is formed, the first gate insulating layer $SiN_x$ is deposited at power of 14 kW to 19 kW and by using a mixture of gases $N_2$, $NH_3$ and $SiH_4$ at a volume ratio of $N_2:NH_3:SiH_4=(10\sim20):(5\sim10):(1\sim2)$, so that the stress value of the first gate insulating layer is reduced to be less than or equal to the threshold. Therefore, this method can reduce the stress gap between the first gate insulating layer and the gate of the thin film transistor, solve the problem of the stress mismatch between the gate of the thin film transistor and the first gate insulating layer. Further, the occurrence probability of bulging of the first gate insulating layer is reduced, and the yield of thin film transistors is improved. Optionally, the gas volume ratio of $N_2:NH_3:SiH_4$ may be 14:5:1.

When the electrode of the thin film transistor is a metal Cu electrode, the stress value of Cu is generally 300 MPa, and the stress value of the first gate insulating layer prepared by the prior process is generally 400 MP. The stress direction of the gate is opposite to the stress direction of the first gate insulating layer, so that the stress gap therebetween is equal to the sum of the stress value thereof. That is, the stress gap is about 700 MPa. After the technical solution according to this embodiment of the present disclosure is adopted, the stress value of the first gate insulating layer can be reduced to be less than or equal to a threshold of 80 MPa. Therefore, this method according to the present disclosure can reduce the stress gap between the first gate insulating layer and the gate to 380 MPa or less, solve the problem of the stress mismatch between the gate of the thin film transistor and the first gate insulating layer, reduce the occurrence probability of bulging of the first gate insulating layer, and improve the yield of the thin film transistor. Generally, after the technical solution of this embodiment of is adopted, the stress gap between the first gate insulating layer and the gate can be controlled between 350 MPa and 450 MPa.

An embodiment of the present disclosure further provides a method for preparing a display substrate, the method including: forming an inorganic insulating layer in contact with a conductive pattern of the display substrate by a plasma enhanced chemical vapor deposition process at power of greater than 9 kW, such that a stress value of the inorganic insulating layer is reduced to be less than or equal to a threshold.

Optionally, the threshold is 80 MPa.

In the embodiment of present disclosure, when the inorganic insulating layer in contact with the conductive pattern of the display substrate is formed, the inorganic insulating layer is deposited at power of greater than 9 kW, such that the stress value of the inorganic insulating film layer is reduced to be less than or equal to a threshold. Optionally, the threshold may be 80 MPa. Therefore, this method can reduce the stress gap between the inorganic insulating layer and the conductive pattern of the display substrate, solve the problem of the stress mismatch between the conductive pattern of the display substrate and the inorganic insulating layer, reduce the occurrence probability of bulging of the inorganic insulating film layer, and improve the yield of the display substrate.

Optionally, before depositing the inorganic insulating film layer, the method of the embodiment further includes: performing plasma treatment on a surface of the substrate to be deposited with the inorganic insulating layer. The plasma treatment on the surface of the substrate to be deposited with the inorganic insulating layer can improve the adhesion of the surface of the substrate to be deposited with the inorganic insulating layer on one hand, and may further reduce the stress value of the inorganic insulating layer on the other hand.

In an optional specific embodiment, the inorganic insulating layer includes silicon nitride ($SiN_x$), and the step of depositing the inorganic insulating film layer includes: depositing $SiN_x$ inorganic insulating layer at power of 9 kW to 25 kW, at a temperature of 190° C. to 380° C. and by using a mixture of gases $N_2$, $NH_3$ and $SiH_4$ at a volume ratio of $N_2:NH_3:SiH_4=(10\sim20):(5\sim10):(1\sim2)$.

Optionally, the power is 14 kW to 19 kW. Further optionally, the gas volume ratio is $N_2:NH_3:SiH_4=14:5:1$.

In another specific embodiment, the step of performing the plasma treatment on the surface of the substrate to be deposited with the inorganic insulating layer to be deposited includes: treating the substrate to be deposited with the inorganic insulating layer for 30 to 40 seconds by a plasma having power of 6 kW to 12 kW and a gas volume ratio of $N_2:NH_3=1\sim5$, thereby improving the adhesion between the inorganic insulating layer and the surface of the substrate to be deposited with the inorganic insulating layer.

Since copper have the characteristics of low resistivity and high electrical mobility, it can significantly reduce the delay effect of resistance and capacitance, improve the operating speed of thin film transistors, and meet the requirements of high-end display devices. Therefore, the conductive pattern may be a metal Cu conductive pattern. Of course, the conductive pattern is not limited to metal Cu, and other metals such as Ag and Al may also be used.

When the conductive pattern of the display substrate is made of metal Cu and the inorganic insulating layer is made of $SiN_x$, the stress value of Cu is generally up to 300 MPa, and the stress value of the inorganic insulating layer prepared by the prior process is generally up to 400 MPa. The stress direction of the conductive pattern is opposite to the stress direction of the inorganic insulating film layer, so that the stress gap therebetween is equal to the sum of the stress value thereof. That is, the stress gap is about 700 MPa. After the technical solution of the embodiment is adopted, the stress value of the inorganic insulating layer can be reduced to 80 MPa or less, so that the difference in stress value between the inorganic insulating layer and the conductive pattern can be reduced to 380 MPa or less. Therefore, the method according to the embodiment of the present disclosure can solve the problem of the stress mismatch between the conductive pattern and the inorganic insulating layer, reduce the occurrence probability of bulging of the inorganic insulating film layer, and improve the yield of the display substrate. Generally, after the technical solution of this embodiment of the present disclosure is adopted, the stress gap value between the inorganic insulating layer and the conductive pattern can be controlled between 350 MPa and 450 MPa.

An embodiment of the present disclosure further provides a display substrate prepared by the method described above.

In the display substrate according to the embodiment of the present disclosure, the stress gap between the inorganic insulating layer and the conductive pattern of the display substrate is reduced, thereby solving the problem of stress mismatch between the conductive pattern of the display substrate and the inorganic insulating layer, reducing the occurrence probability of bulging of the inorganic insulating layer, and improving the yield of the display substrate.

An embodiment of the present disclosure further provides a display device including the display substrate as described above. The display device may include any product or component having a display function, such as a television, a display, a digital photo frame, a mobile phone, and a tablet computer. Optionally, the display device further includes a flexible circuit board, a printed circuit board, and a backplane.

Unless otherwise defined, technical terms or scientific terms used herein have the normal meaning commonly understood by one skilled in the art in the field of the present disclosure. The words "first", "second", and the like used in the present disclosure does not denote any order, quantity, or importance, but rather merely serves to distinguish different components. The "including", "comprising", and the like used in the present disclosure means that the element or item appeared in front of the word encompasses the element or item and their equivalents listed after the word, and does exclude other elements or items. The word "connected" or "connecting" and the like are not limited to physical or mechanical connections, but may include electrical connections, whether direct or indirect. "On", "under", "left", "right" and the like are only used to represent relative positional relationships, and when the absolute position of the described object is changed, the relative positional relationship may also be changed, accordingly. It will be understood that when an element, such as a layer, film, region, or substrate, is referred to as being "on" or "under" another element, the element may be directly "on" or "under" another element, or there may be an intermediate element.

The above description is alternative embodiments of the present disclosure. It should be noted that one skilled in the art would make several improvements and substitutions without departing from the principles of the present disclosure. These improvements and modifications should also be regarded as the protection scope of the present disclosure.

What is claimed is:

1. A method for preparing a thin film transistor, comprising:

forming an inorganic insulating layer in contact with an electrode of the thin film transistor by a plasma enhanced chemical vapor deposition process at power of 14 kW to 25 kW, at a temperature of 190° C. to 380° C. and by using a mixture of gases $N_2$, $NH_3$ and $SiH_4$ in a volume ratio of $N_2$:$NH_3$:$SiH_4$=(10~20):(5~10):(1~2), such that a stress value of the inorganic insulating layer is reduced to be less than or equal to a threshold, and the inorganic insulating layer comprises silicon nitride, wherein the threshold is 80 MPa or less.

2. The method of claim 1, wherein the method further comprises: performing plasma treatment on a surface of a substrate to be deposited with the inorganic insulating layer before depositing the inorganic insulating layer.

3. The method of claim 2, wherein the performing the plasma treatment on the surface of the substrate to be deposited with the inorganic insulating layer comprises:

treating the substrate to be deposited with the inorganic insulating layer for 30 to 40 seconds by a plasma having power of 6 kW to 12 kW and a gas volume ratio of $N_2$:$NH_3$=1~5.

4. The method of claim 1, wherein the inorganic insulating layer is a gate insulating layer, and an electrode of the thin film transistor is a metal Cu electrode.

5. A method for preparing a display substrate, comprising:

forming an inorganic insulating layer in contact with a conductive pattern of the display substrate by a plasma enhanced chemical vapor deposition process at power of 14 kW to 25 kW, at a temperature of 190° C. to 380° C. and by using a mixture of gases $N_2$, $NH_3$ and $SiH_4$ in a volume ratio of $N_2$:$NH_3$:$SiH_4$=(10~20):(5~10):(1~2), such that a stress value of the inorganic insulating layer is reduced to be less than or equal to a threshold, and the inorganic insulating layer comprises silicon nitride, wherein the threshold is 80 MPa or less.

6. The method of claim 5, wherein the method further comprises: performing plasma treatment on a surface of the substrate to be deposited with the inorganic insulating layer before depositing the inorganic insulating layer.

7. The method of claim 6, wherein the performing the plasma treatment on the surface of the substrate to be deposited with the inorganic insulating layer comprises:

treating the substrate to be deposited with the inorganic insulating layer for 30 to 40 seconds by a plasma having power of 6 kW to 12 kW and a gas volume ratio of $N_2$:$NH_3$=1~5.

8. The method of claim 5, wherein the inorganic insulating layer is a gate insulating film, and the conductive pattern is a metal Cu conductive pattern.

* * * * *